(12) United States Patent
Elia

(10) Patent No.: US 7,899,417 B2
(45) Date of Patent: Mar. 1, 2011

(54) METHOD AND APPARATUS FOR INCREASING THE EFFICIENCY OF LOW POWER AMPLIFIERS

(75) Inventor: Avner Elia, Ramat Ishai (IL)

(73) Assignee: Paragon Communications Ltd., Haifa (IL)

( * ) Notice: Subject to any disclaimer, the term of this patent is extended or adjusted under 35 U.S.C. 154(b) by 613 days.

(21) Appl. No.: 11/996,221

(22) PCT Filed: Jul. 20, 2006

(86) PCT No.: PCT/IL2006/000848
§ 371 (c)(1),
(2), (4) Date: Jan. 27, 2008

(87) PCT Pub. No.: WO2007/010543
PCT Pub. Date: Jan. 25, 2007

(65) Prior Publication Data
US 2008/0211587 A1    Sep. 4, 2008

(51) Int. Cl.
*H01Q 11/12* (2006.01)
*H04B 1/04* (2006.01)

(52) U.S. Cl. .................. 455/125; 455/127.5

(58) Field of Classification Search ............ 455/107, 455/120, 125, 127.1, 127.2, 127.5; 330/127, 330/199
See application file for complete search history.

(56) References Cited

U.S. PATENT DOCUMENTS

| | | |
|---|---|---|
| 4,985,686 A | 1/1991 | Davidson et al. |
| 5,408,691 A | 4/1995 | Takao |
| 6,020,787 A | 2/2000 | Kim et al. |
| 6,437,641 B1 | 8/2002 | Bar-David |
| 6,831,519 B2 | 12/2004 | Bar-David et al. |
| 2003/0112077 A1* | 6/2003 | Goutti et al. .............. 330/298 |
| 2004/0018821 A1 | 1/2004 | Bar-David |
| 2004/0222847 A1 | 11/2004 | Khanifar et al. |
| 2009/0021302 A1* | 1/2009 | Elia .......................... 330/127 |

FOREIGN PATENT DOCUMENTS

GB         2356093 A         5/2001

OTHER PUBLICATIONS

Cripps, C. Steve, "RF Power Amplifiers for Wireless Communications", Artech House, 1999.

* cited by examiner

*Primary Examiner*—Nguyen Vo
(74) *Attorney, Agent, or Firm*—Marsteller & Associates, P.C.

(57) ABSTRACT

The present invention is directed to a method for reducing the current consumption and increasing the efficiency of an RF power amplifier (PA), while maintaining the output power. The desired output power of the PA is determined and for each level of the desired output power, the load that is connected to the output stage of the PA is tuned to essentially match the output impedance of the output stage to provide maximal gain. By doing so, the dynamic RF load line has a slope that causes it to intersect with the drain-source (or emitter-collector, in case of a bipolar transistor) voltage, across the output stage, at a value that corresponds to the voltage swing required to provide the desired output power.

12 Claims, 2 Drawing Sheets

METHOD AND APPARATUS FOR INCREASING THE EFFICIENCY OF LOW POWER AMPLIFIERS

FIELD OF THE INVENTION

The present invention relates to the field of high efficiency power amplifiers. More particularly, the invention relates to a matching technique for reducing current consumption of enhanced efficiency RF power amplifiers, without the need for changing its DC power supply and essentially without changing the output power.

BACKGROUND OF THE INVENTION

The technique of eXcess eNvelope enhancement (XNN®) for power amplifiers (PAs), particular for the low power WiFi and WiMAX market applications is disclosed in U.S. Pat. No. 6,437,641. This technique is a simplification of Envelope Tracking (ET), which is disclosed in US 2004/0018821.

The Voltage Enhancement Circuit (VEC™), disclosed in U.S. Pat. No. 6,831,519, modulates the supply voltage of power amplifiers as part of the XNN® technique. Appropriate modulation of the supply voltage prevents saturation of the power amplifier, while amplifying signals that exceed a pre-defined programmable threshold.

Most of the XNN® implementations produce two positive effects while maintaining a constant EVM (Error Vector Magnitude), i.e., increasing the efficiency, while increasing output power or increasing efficiency while reducing DC power supply voltage. In some applications, only efficiency improvement is necessary while the amplifier gain, output power, operating voltage and EVM performance must not be altered. This is effectively results in current reduction of the amplifier, while keeping all other operating parameters constant.

Conventional RF amplifiers required to simultaneously amplify RF signals that have large peak-to-average ratios, are costly and relatively inefficient (i.e., consume much DC power). However, during most of the time, the power output is only a small fraction of the power consumed from the Direct Current (DC) power supply, resulting in low efficiency. The reason for such inefficiency is that on one hand, the DC conditions should be set to values that will be able to provide large power output, but on the other hand, for these DC conditions, such a power amplifier becomes efficient only during the occurrence of the peaks, i.e., when the instantaneous power output is large.

One conventional way to handle signals with large peak-to-average ratios is to control the DC power supply to a power amplifier. One voltage level is supplied to such a power amplifier whenever the instantaneous amplitude is below a given level (normal operating condition), and an enhanced (and higher) voltage level whenever the instantaneous amplitude is above this level. This solution is described for example, in U.S. Pat. No. 6,437,641, which discloses circuitry for dynamically enhancing the operating voltage of an RF amplifier. The resulting input drive to the PA is increased, thereby pushing its output well into saturation and handles the signal clipping by instantaneously enhancing the power supply voltage.

Still, the methods described above has provided satisfactory solutions to the problem of improving the efficiency of power amplifiers operated under large peak-to-average ratios, while eliminating the need for clipping signals having large peak amplitudes.

It is an object of the present invention to provide a method for efficiently controlling the impedance at the output RF path for reducing current consumption of the PA.

It is another object of the present invention to provide a method for efficiently controlling the impedance at the output RF path for increasing the RF large signal gain of the amplifier without increasing the current consumption of the PA.

It is a further object of the present invention to provide circuitry for efficiently and independently controlling the current consumption, gain and output power of the PA.

Other objects and advantages of the invention will become apparent as the description proceeds.

SUMMARY OF THE INVENTION

The present invention is directed to a method for reducing the current consumption and increasing the efficiency of an RF power amplifier (PA), while maintaining the output power. The desired output power of the PA is determined and for each level of the desired output power, the load that is connected to the output stage of the PA is tuned to essentially match the output impedance of the output stage to provide maximal gain. By doing so, the dynamic RF load line has a slope that causes it to intersect with the drain-source (or emitter-collector, in case of a bipolar transistor stage) voltage, across the output stage, at a value that corresponds to the voltage swing required to provide the desired output power. Whenever the actual output power is smaller than the desired output power the load is tuned such that the dynamic RF load line has a slope that causes it to intersect with the drain-source voltage, across the output stage, at a value that is closest to the value that corresponds to the voltage swing required to provide the desired output power. Whenever the actual output power is still smaller than the desired output power, the load is further tuned, such that the dynamic RF load line has a slope that is closer to the slope of the longest load line that intersects the drain-source voltage across the output stage at a value being the maximal allowable swing. Whenever the actual output power is still smaller than the desired output power, the DC power supplied to the output stage is enhanced by a level that causes the dynamic RF load line to intersect the drain-source voltage at a value being closer to the maximal allowable swing, while essentially keeping its slope. This step is repeated until the load line coincides with the longest load line. The load or the desired output power may be tuned dynamically.

The DC power supplied to the output stage may be enhanced by an XNN® circuit. The PA operated under Class B, Class AB, Class C or other efficient non-linear class.

The present invention is also directed to an apparatus for reducing the current consumption and increasing the efficiency of an RF power amplifier (PA), while maintaining the output power, that comprises: circuitry for tuning the load, connected to the output stage of the PA, to essentially match the output impedance of the output stage to provide maximal gain, such that the dynamic RF load line has a slope that causes it to intersect with the drain-source voltage, across the output stage, at a value that corresponds a voltage swing required to provide the desired output power and such that the dynamic RF load line has a slope that causes it to intersect with the drain-source voltage, across the output stage, at a value that is closest to the value that corresponds to the voltage swing required to provide the desired output power, whenever the actual output power is smaller than the desired output.

The apparatus may further comprise circuitry for enhancing the DC power supplied to the output stage, by a level that causes the dynamic RF load line to intersect the drain-source voltage at a value being closer to the maximal allowable swing, while essentially keeping its slope, until the load line coincides with the longest load line.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

The present invention discloses a method and apparatus for applying XNN® technology for reducing the current consumption of a PA, without changing the DC power supply or the output power by retuning of the amplifier RF matching circuits. As a result, additional advantages are obtained: achieving higher power gain and lower heat dissipation on the main stage transistor of the PA. Such tuning or retuning may be done statically or dynamically, depending on power and efficiency requirements. Load tuning can be done for example, by adding or subtracting reactive components using RF switching, using variable-reactor diodes etc.

Figure 1:
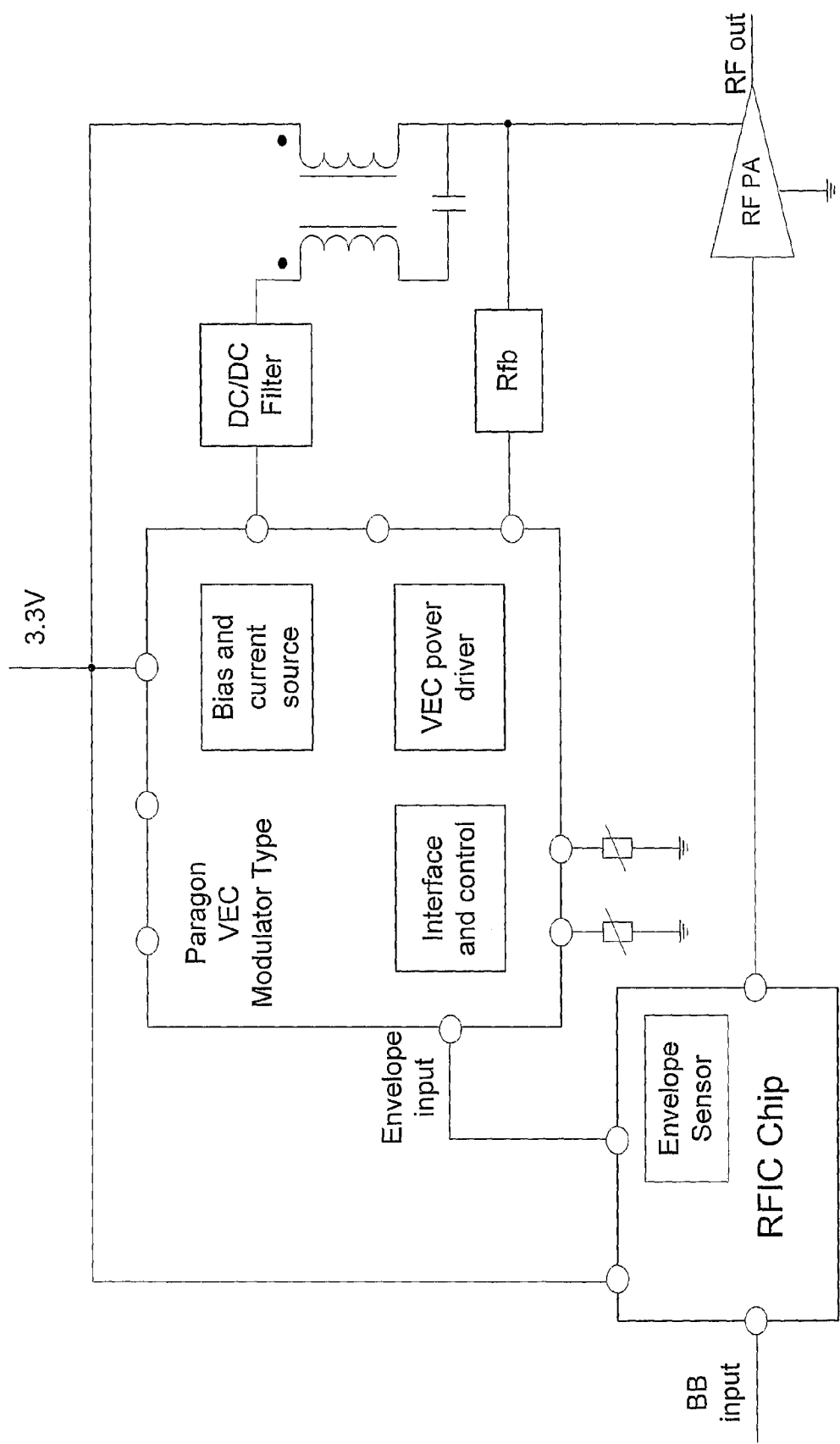
FIG. 1 (Prior Art) illustrates a typical implementation of an XNN® PA.

A typical implementation of an XNN® PA is illustrated in FIG. 1 (Prior Art). The Envelope Sensor (ES) provides high-level detection of the transmitted signals. A conventional technique for detection of RF signals employs diode-based detector. However, such detector diodes are usually capable of handling low power signals in the order of 1-10 mW. The VEC™ circuit (as described in U.S. Pat. No. 6,831,519) requires input signals of the order of 30-300 mW. Therefore, whenever a diode-based detector is used to detect the envelope of the RF signal, it requires amplification, which results in a substantial delay which is unacceptable for most of the XNN® applications.

According to the present invention, the current consumption of a power amplifier (PA) operating under large peak-to-average ratio signals that is equipped with efficiency enhancement circuit (e.g., such as the one disclosed in U.S. Pat. No. 6,437,641) is reduced by tuning the matching circuit of the RF amplifier in order to reduce the current and enhance the power gain of the amplifier on the expense of output power level (since the matching circuit of the RF amplifier is tuned to maximal gain, rather than to maximal output power). As a result, the output power is regained and efficiency is increased by applying the XNN® technique, whenever required, for compensating the reduction in the maximal output power. Such a situation often happens, for example, in power amplifiers that are used in cellular devices. The output transmission power of such devices depends in their distance from the base station of their current cell. Whenever the base station is relatively far, from the device, the device is required to transmit high output transmission power (usually 1 Watt). On the other hand, whenever the base station is relatively close, to the device (e.g., in urban areas), the device is required to transmit much lower output transmission power (usually 0.1 Watt). Therefore, similar load matching will result in efficiency reduction during the time period when the device is required to transmit much lower output transmission power. According to the invention, in order to increase efficiency, the load matching is tuned to maximal gain while transmitting lower output transmission power. Whenever higher power is required (during the peak periods only), the output power is increased by adding enhancement, which does not deteriorate efficiency.

The current consumption increases slower than the output power, which leads to significant efficiency improvement. Consequently, few side effects occur:

(a) The output power increases by a square law of the voltage-enhancing ratio.

(b) The input drive requirements increase by the same factor.

(c) The RF line-up should be re-designed to track these changes.

However, these side effects, especially the increase of the current consumption, can be eliminated by using the technique disclosed hereinbelow. The new technique of the present invention even allows reducing the current consumption and enhancing the PA gain, without affecting the output power and the system EVM, or the spectral distribution.

Two kinds of RF matching techniques are commonly used for power amplifier matching. Maximal power gain is achieved while using conjugate matching circuit. Higher output 1 dB compression point, but lower power gain is achieved while using power-matching circuit. In cases where the current and voltage limitations of the power transistors are dominant, power matching is usually used. In a typical situation, a conjugate match yields a 1 dB compression power about 2 dB lower than that which can be obtained by correct power tuning (depending on the transistor being matched), as shown for example, in Cripps, C. Steve, "RF Power Amplifiers for Wireless Communications", Artech House, 1999.

Reduced conduction angle, high efficiency amplifier classes of operation, known also as class AB, Class B and Class C configurations or conventional high efficiency mode are widely used. Extensive analysis of the expected efficiency of these modes might be found in many references, for example, in Cripps.

The following analysis will concentrate on the class B case, neglecting transistor knee voltage. Similar analysis may be straightforwardly performed for any other class. First, classical analysis of class B operation will be reviewed. Then, the current limitation $I_{MAX}$ will be redefined to get an arbitrary value. The effect of such definition on power amplifier performance will be discussed. XNN® circuitry will be added to compensate for output power reduction and for efficient enhancement.

The basic results evaluating the DC power and the fundamental RF output signals for conduction angle $\alpha$ and $2\pi$ are listed below:

$$I_{DC} = \frac{I_{MAX}}{2\pi} \frac{2\mathrm{Sin}(\alpha/2) - \alpha\mathrm{Cos}(\alpha/2)}{1 - \mathrm{Cos}(\alpha/2)}$$

$$I_{RF} = \frac{I_{MAX}}{2\pi} \frac{\alpha - \mathrm{Sin}(\alpha)}{1 - \mathrm{Cos}(\alpha/2)}$$

Where $I_{DC}$ is the average DC current drawn from the power supply $I_{RF}$ is the fundamental component of the RF current $I_{MAX}$ is the maximum instantaneous current allowed flowing through the power stage transistor.

For Class B Operation:

$$I_{DC} = I_{MAX}/\pi$$

$$I_{RF} = I_{MAX}/2$$

Assuming that the maximum voltage swing will be generated at the input drive level corresponding to a peak current of $I_{MAX}$, The RF fundamental output power is expressed by:

$$P_{RF} = V_{DC} I_{RF}/2$$

$$P_{DC} = V_{DC} I_{DC}$$

The power added efficiency (PAE) is defined by:

$$PAE = \frac{P_{RF} - P_{IN}}{P_{DC}}$$

Where $P_{IN}$ is the RF driving power.

With little mathematical manipulation, the classical efficiency of $\pi/4$ for this case can be deduced.

The parameter $I_{MAX}$ determines the 1 dB compression but is hardly affecting the system efficiency. It can be determined to give the specific peak power specified by the designer up to the saturation current of the transistor. If the swing of the drain voltage is maximal, the efficiency solely depends on the conducting angle.

The efficiency of a class B amplifier is $\pi/4$, as can be seen above. In theory, 6 dB more drive than class A is needed. Using the original input power will cause a reduction in efficiency down to the above number. Increasing the load resistance and allowing the voltage swing to increase to its maximum value, will cause the efficiency be back $\pi/4$. The power gain will increase by 3 dB. The loss in output power can be compensated by using XNN®. The efficiency is improved by a factor of square root of the increasing power.

The amplifier class of operation and the quoted power enhancement here are for reference and in order to make the explanation clearer. Any other conducting angle and power enhancement can benefit from this method, proposed by the present invention.

Figure 2:
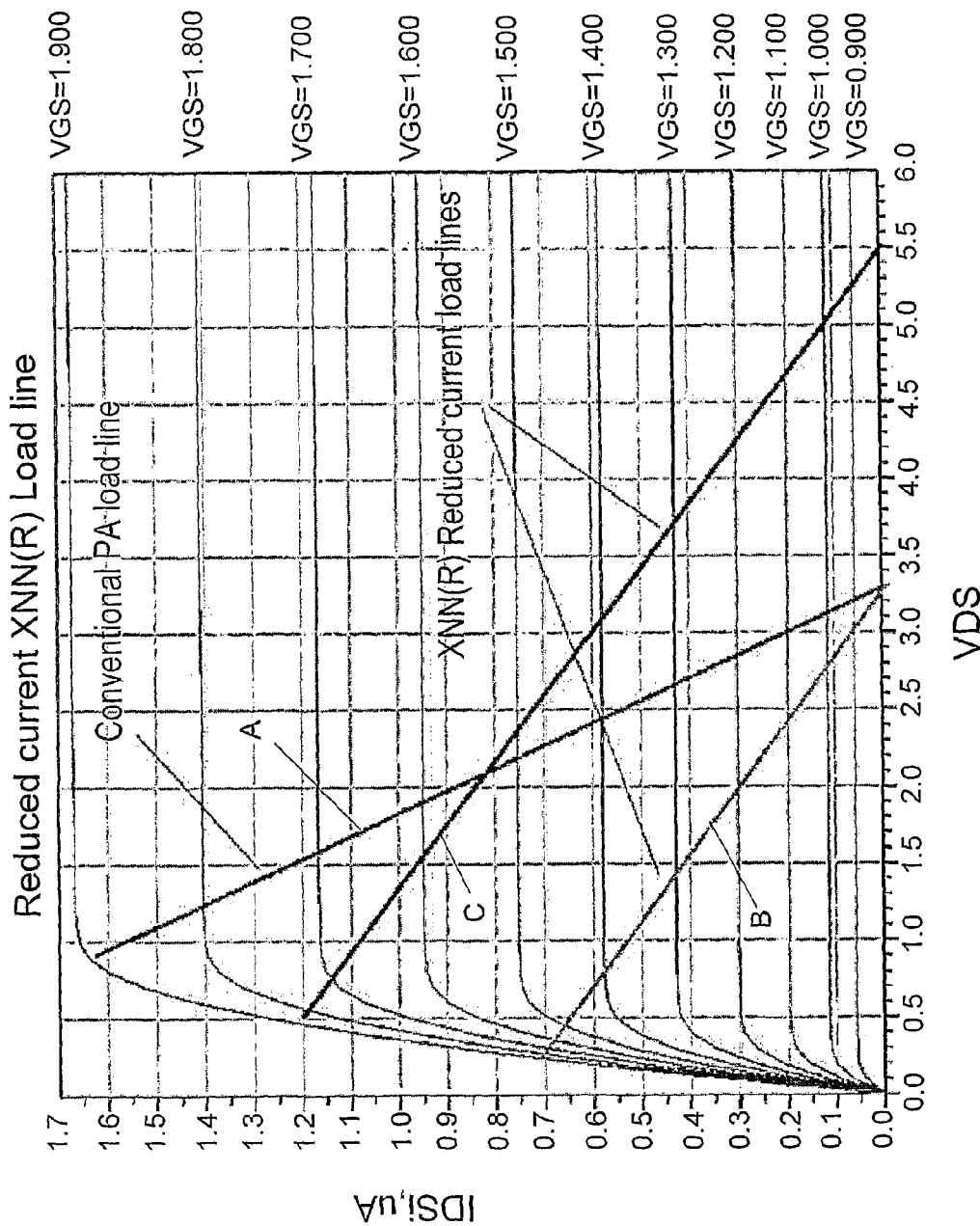
FIG. 2 schematically illustrates tuned load lines with enhancement, according to a preferred embodiment of the invention.

FIG. 2 schematically illustrates tuned load lines with enhancement, according to a preferred embodiment of the invention. Load line A is for a conventional class B power amplifier. Load line B is the XNN® power amplifier below threshold and Load line C is at maximum enhanced point. Each of the load lines A and B corresponds to a different load match, which determines the slope of the corresponding load line. It can be noticed that only at maximum enhancement the XNN® power amplifier load line length exceeds the conventional PA load line length. This is the reason for enhanced efficiency of the XNN® power amplifier. The graph also clearly shows how reduced current mode is achieved. Graph B illustrates the load tuning effect without DC power enhancement—the slope is set such that the length of the load line intersects with the drain-source voltage axis at a higher value, across said output stage, at a value that is closest to the value that corresponds to the voltage swing required to provide the desired output power. Line C illustrates the enhancement operation. Whenever the actual output power is still smaller than the desired output power, power enhancement "pushes" load line B while keeping its slope essentially constant, until load line C is obtained. Load line C intersects the drain-source voltage axis at the maximal allowable swing. This represents the maximal enhancement, which also corresponds to the longest load line. Of course, smaller enhancement can be applied. In this case, load line B will be "pushed" less, while keeping its slope essentially constant, resulting in an intermediate load line, which is longer than B but shorter than C.

A method for reducing the current of a power amplifier without affecting its output power or 1 dB compression point was described. The method allows using the XNN® technique for cases where current reduction is needed while neither output power enhancement is not needed, nor DC power supply voltage reduction is permitted. Significantly better RF power gain, compared to the compatible class of operation, and lower heat dissipation in the power transistor stage are additional benefits achieved while using this technique.

The above examples and description have of course been provided only for the purpose of illustration, and are not intended to limit the invention in any way. As will be appreciated by the skilled person, the invention can be carried out in a great variety of ways, e.g., using bipolar transistors, employing more than one technique from those described above, all without exceeding the scope of the invention.

The invention claimed is:

1. A method for reducing the current consumption and increasing the efficiency of an RF power amplifier (PA), while maintaining the output power, comprising:
   a) determining the desired output power of said PA;
   for each level of the desired output power:
   b) tuning the load, connected to the output stage of said PA, to essentially match the output impedance of said output stage to provide maximal gain, such that the dynamic RF load line has a slope that causes it to intersect with a drain-source voltage, across said output stage, at a value that corresponds to the voltage swing required to provide said desired output power; and
   c) whenever the actual output power is smaller than said desired output power, further tuning said load, such that the dynamic RF load line has a slope that causes it to intersect with the drain-source voltage, across said output stage, at a value that is closest to the value that corresponds to the voltage swing required to provide said desired output power.

2. A method according to claim 1, further comprising:
   a) whenever the actual output power is still smaller than said desired output power, further tuning said load, such that the dynamic RF load line has a slope that is closer to the slope of the longest load line that intersects the drain-source voltage across said output stage at a value being the maximal allowable swing; and
   b) whenever the actual output power is still smaller than said desired output power, enhancing the DC power supplied to the output stage, by a level that causes said dynamic RF load line to intersect said drain-source voltage at a value being closer to the maximal allowable swing, while essentially keeping its slope; and
   c) repeating the preceding step, until said load line coincides with said longest load line.

3. A method according to claim 1, wherein the DC power supplied to the output stage, is enhanced by an XNN circuit.

4. A method according to claim 1, wherein the PA operated under the following classes:
   Class B;
   Class AB;
   Class C.

5. A method according to claim 1, wherein the load is tuned dynamically.

6. A method according to claim 1, wherein the desired output power is determined dynamically.

7. Apparatus for reducing the current consumption and increasing the efficiency of an RF power amplifier (PA), while maintaining the output power, comprising:
   a) circuitry for tuning the load, connected to the output stage of said PA, to essentially match the output impedance of said output stage to provide maximal gain, such that the dynamic RF load line has a slope that causes it to intersect with a drain-source voltage, across said output stage, at a value that corresponds a voltage swing required to provide said desired output power and such that the dynamic RF load line has a slope that causes it to intersect with the drain-source voltage, across said output stage, at a value that is closest to the value that corresponds to the voltage swing required to provide said desired output power, whenever the actual output power is smaller than said desired output.

8. Apparatus according to claim 7, further comprising circuitry for enhancing the DC power supplied to the output stage, by a level that causes said dynamic RF load line to intersect said drain-source voltage at a value being closer to the maximal allowable swing, while essentially keeping its slope, until said load line coincides with said longest load line.

9. Apparatus according to claim 7, in which the DC power supplied to the output stage, is enhanced by an XNN circuit.

10. Apparatus according to claim 7, in which the PA operated under the following classes:
   Class B;
   Class AB;
   Class C.

11. Apparatus according to claim 7, in which the load is tuned dynamically.

12. Apparatus according to claim 7, in which the desired output power is determined dynamically.

* * * * *